(12) United States Patent
Ku et al.

(10) Patent No.: US 9,470,716 B2
(45) Date of Patent: Oct. 18, 2016

(54) PROBE MODULE

(71) Applicant: MPI CORPORATION, Zhubei (TW)

(72) Inventors: Wei-Cheng Ku, Zhubei (TW); Hao Wei, Zhubei (TW); Chen-Kang Chiu, Zhubei (TW)

(73) Assignee: MPI CORPORATION, Zhubei (TW)

( * ) Notice: Subject to any disclaimer, the term of this patent is extended or adjusted under 35 U.S.C. 154(b) by 147 days.

(21) Appl. No.: 14/557,697

(22) Filed: Dec. 2, 2014

(65) Prior Publication Data

US 2015/0185253 A1    Jul. 2, 2015

(30) Foreign Application Priority Data

Dec. 31, 2013  (TW) .............................. 102149319 A

(51) Int. Cl.
 *G01R 31/20*  (2006.01)
 *G01R 1/067*  (2006.01)

(52) U.S. Cl.
 CPC ................. *G01R 1/06772* (2013.01)

(58) Field of Classification Search
 CPC .......... G01R 19/0084; G01R 31/2648; G01R 1/06705; G01R 1/06788; G01R 1/07307; G01R 31/2867; G01R 31/2893; G01R 1/07342; G01R 31/26; G01R 31/2642; G01R 31/2831; G01R 31/31702; G01R 1/0491; G01R 31/265; G01R 31/318511; H01L 2224/50; H01L 2225/06579; H01L 24/50
 See application file for complete search history.

(56) References Cited

U.S. PATENT DOCUMENTS

| | | | | |
|---|---|---|---|---|
| 4,697,143 A * | 9/1987 | Lockwood | ......... | G01R 1/07342 324/750.27 |
| 6,636,054 B2 * | 10/2003 | Lyford | ............... | G01R 1/06788 324/715 |
| 7,102,370 B2 * | 9/2006 | Cannon | .............. | G01R 1/06788 324/754.02 |
| 2015/0185253 A1 | 7/2015 | Ku et al. | | |

FOREIGN PATENT DOCUMENTS

| | | |
|---|---|---|
| CN | 1177226 | 11/2004 |
| TW | M358968 | 6/2009 |

* cited by examiner

*Primary Examiner* — Tung X Nguyen
(74) *Attorney, Agent, or Firm* — Tracy M. Heims; Lynette Wylie; Apex Juris, PLLC

(57) ABSTRACT

A probe module including a housing, a PCB, three probes, a resonating member, and a signal connector. The housing has a room therein, a first opening, and a second opening at opposite ends thereof. The PCB is received in the room of the housing, and has a substrate, on which a circuit and two groundings are provided. The probes are electrical connected to the circuit and the groundings of the PCB respectively, and then extend out of the housing via the first opening. The resonating member has a chamber, and is attached to the PCB. The signal connector is connected to the PCB, and extends out of the housing via the second opening. The signal connector has a signal transmission portion electrically connected to the circuit of the PCB, and a grounding portion electrically connected to the at least one grounding of the PCB.

10 Claims, 4 Drawing Sheets

PROBE MODULE

BACKGROUND OF THE INVENTION

1. Technical Field

The present invention relates to an electrical testing device, and more particularly to a probe module.

2. Description of Related Art

Probe card is the commonest device to test the electrical connection of the electronic. The conventional probe card is electrically connected to a device under test (DUT) and a tester respectively to transmit electrical signals therebetween.

In order to improve the precision of the test, the outer case of the conventional probe card is asked to have a precise scale to avoid the interference in signal transmission which is caused by change of electric field because of the difference in scale of the outer case. Therefore, the work for assembling the conventional probe card is very difficult, and the yield rate is poor, and most of that, the conventional probe card can't afford the precise test.

BRIEF SUMMARY OF THE INVENTION

In view of the above, the primary objective of the present invention is to provide a probe module, which is easy to be manufactured, and has high precise in test.

In order to achieve the objective of the present invention, a probe module including a housing, a PCB, a plurality of probes, a resonating member, and a signal connector. The housing has a room therein, a first opening, and a second opening at opposite ends thereof, wherein the first opening and the second opening are at opposite ends of the housing, and communicated with the room. The PCB is received in the room of the housing, and has a substrate, on which a circuit and at least one grounding are provided, wherein the substrate is connected to the housing. The probes are made of a conductive material, and fixed to the substrate by welding. The probes are electrical connected to the circuit and the at least one grounding of the PCB respectively, and extend out of the housing via the first opening. The resonating member has a chamber and an opening communicated with the chamber. The resonating member is attached to the PCB with a side having the opening. The resonating member is between the PCB and the housing, and the chamber has a sidewall facing the substrate of the PCB. The signal connector is connected to the PCB, and extends out of the housing via the second opening. The signal connector has a signal transmission portion and a grounding portion. The signal transmission portion is electrically connected to the circuit of the PCB, and the grounding portion is electrically connected to the at least one grounding of the PCB.

With such design, the resonating member may stabilizes the effect of electric field to increase the efficiency of assembling the probe module as well as to increase the precision of the test.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
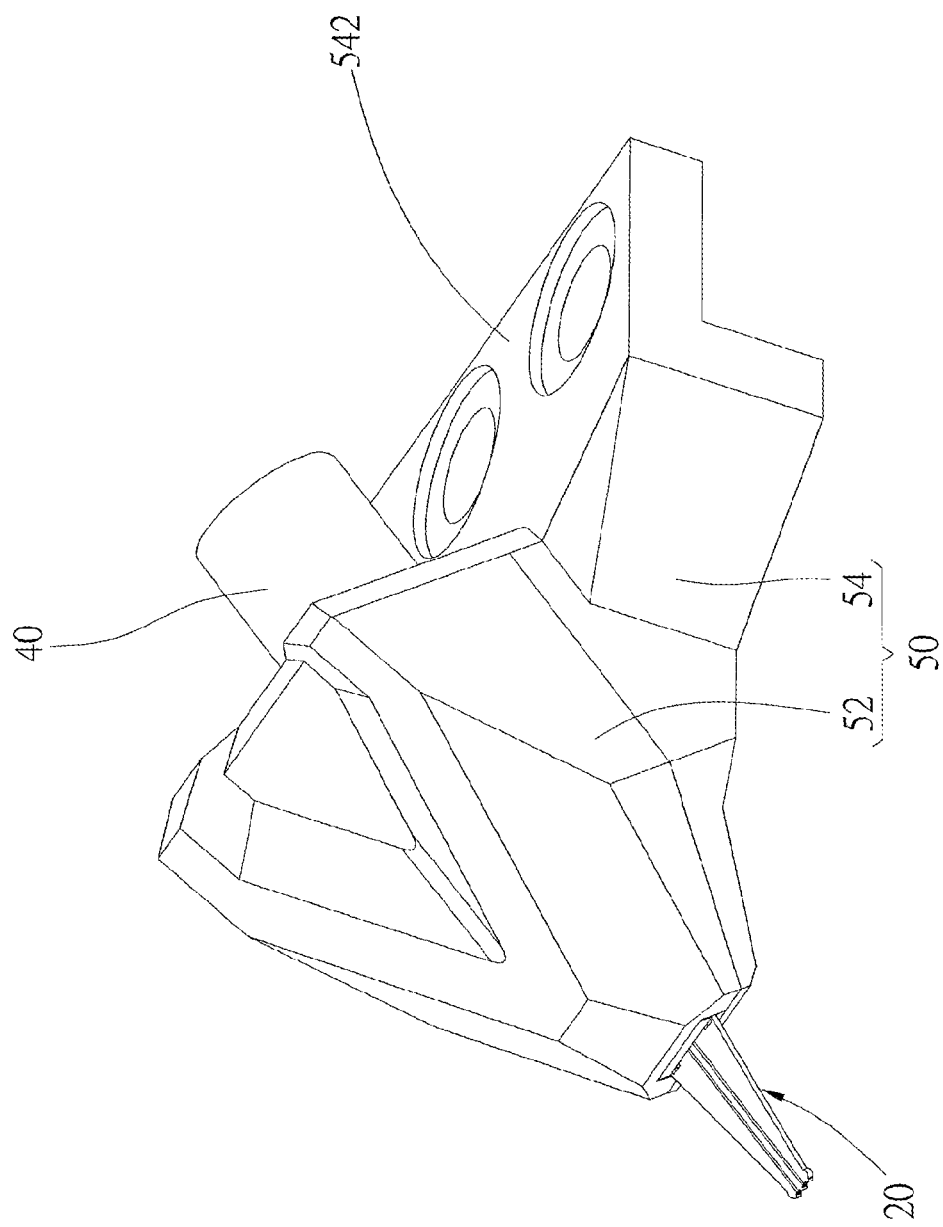
FIG. 1 is a perspective view of a preferred embodiment of the present invention.
Figure 2:
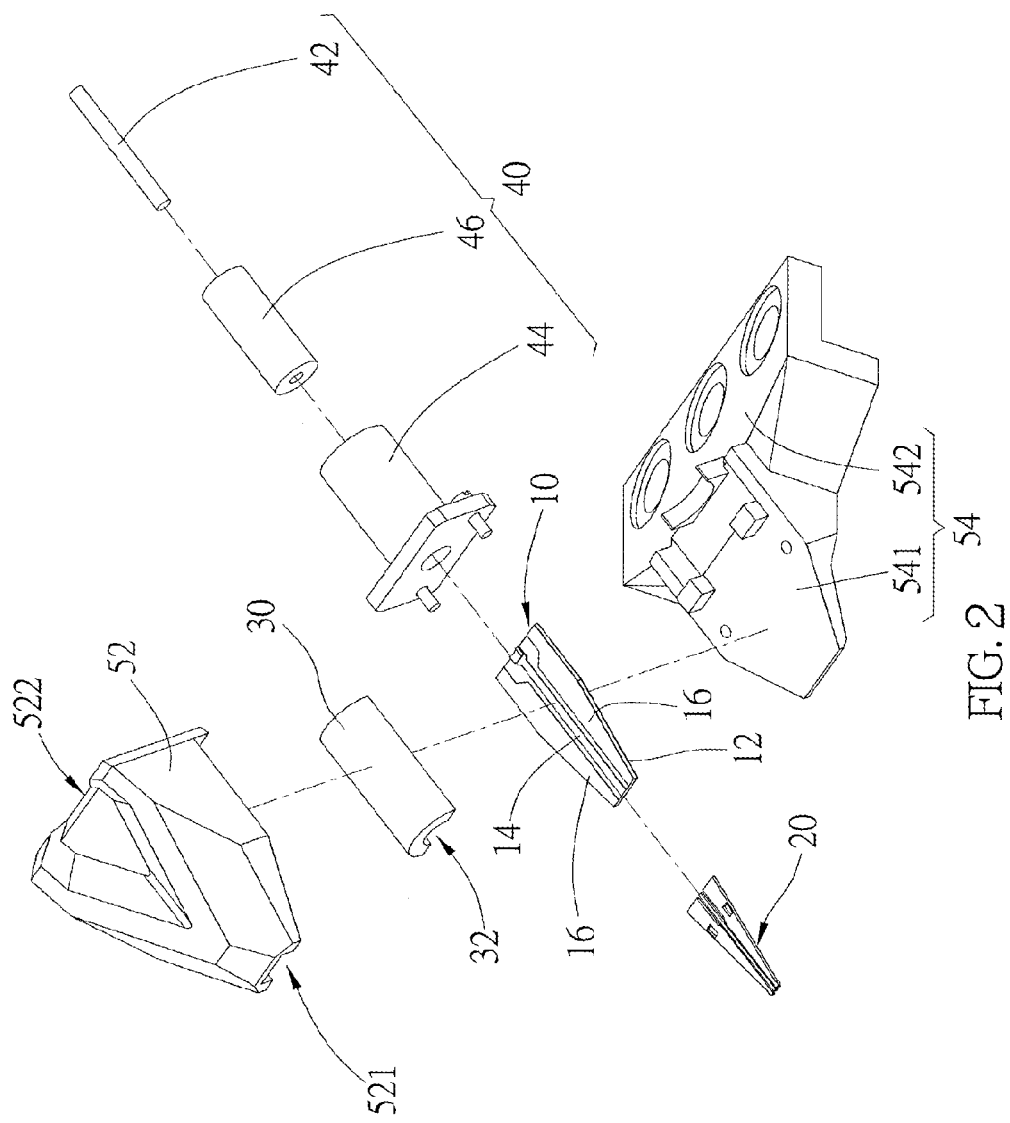
FIG. 2 is an exploded view of the preferred embodiment of the present invention.

As shown in FIG. 1 and FIG. 2, a probe module of the preferred embodiment of the present invention, which is adapted to connect to a tester (not shown) and a DUT (not shown) respectively for transmitting electrical signals, includes a printed circuit board (PCB) 10, a probe set 20, a resonating member 30, a signal connector 40, and a housing 50.

The PCB 10, in the present embodiment, has a rectangular substrate 12, on which a circuit 14 and two groundings 16 are provided. The circuit 14 is between the groundings 16.

Figure 3:
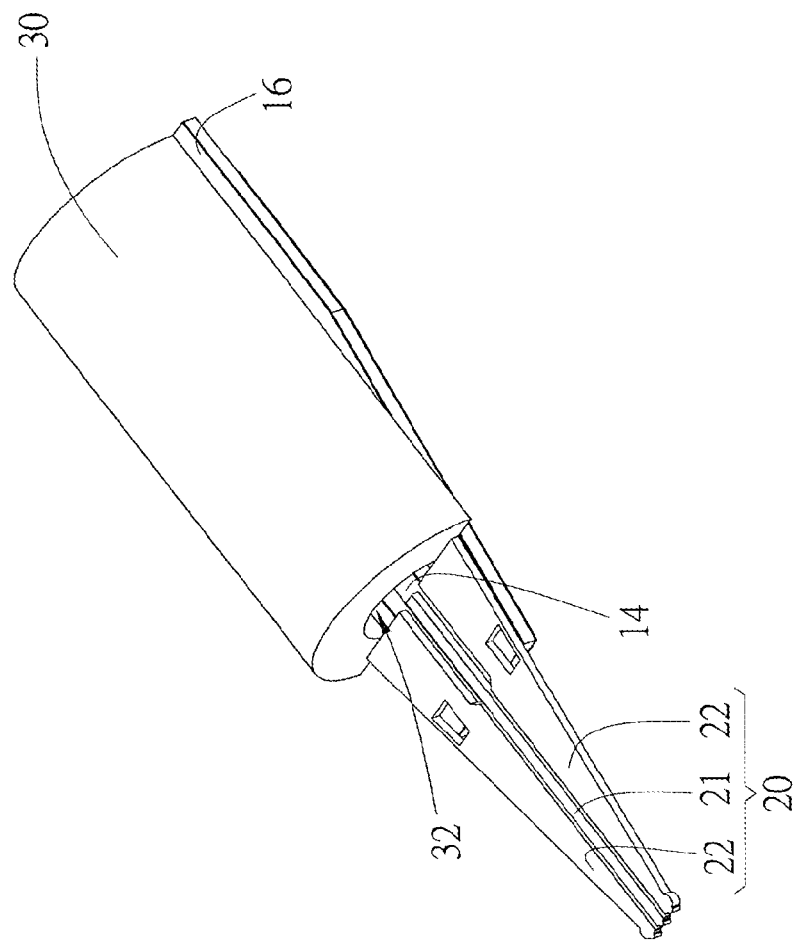
FIG. 3 is a perspective view of the preferred embodiment of the present invention, showing the probe set and the resonating member on the PCB.

As shown in FIG. 3, the probe set 20 has three conductive probes, two of which are grounding probes 21, and the third of which is a signal probe 22. The probes are adapted to touch specific pads (not shown) on the DUT. A size of each grounding probe 21 is greater than that of the signal probe 22. Ends of the grounding probes 21 are fixed to the substrate 12 by welding, and electrically connected to the groundings 16 respectively. The signal probe 22 is fixed to the substrate 12 by welding as well, and electrically connected to the circuit 14. Therefore, the signal probe 22 is between the grounding probes 21.

The resonating member 30 has a chamber 32 therein and an opening at an end thereof. The opening is communicated with the chamber 32. In the present embodiment, the resonating member 30 is a metal block with a semicircular cross section. The resonating member 30 is provided with an elongated slot, which has a semicircular cross section, at a flat side to form the chamber 32 with a semicircular sidewall, and the slot is opened at the flat side to form the opening. The slot is opened at opposite ends of the metal block as well. It is noted that the resonating member 30 could be any shape and size rather than the one shown in drawings. The flat side of the resonating member 30 is attached to the PCB 10, and the opposite ends thereof are electrically connected to the groundings 16 by welding. Whereby the opening is sealed by the PCB 10.

The signal connector 40 is connected to the PCB 10, and has a signal transmission portion 42 and a grounding portion 44. The signal transmission portion 42 is electrically connected to the circuit 14, and the grounding portion 44 is electrically connected to the groundings 16. In the present embodiment, the signal transmission portion 42 is a metal rod, and the grounding portion 44 is a metal ring surrounding the metal rod of the signal transmission portion 42. An insulating pad 46 is provided between the signal transmission portion 42 and the grounding portion 44 to avoid signal interference or short.

Figure 4:
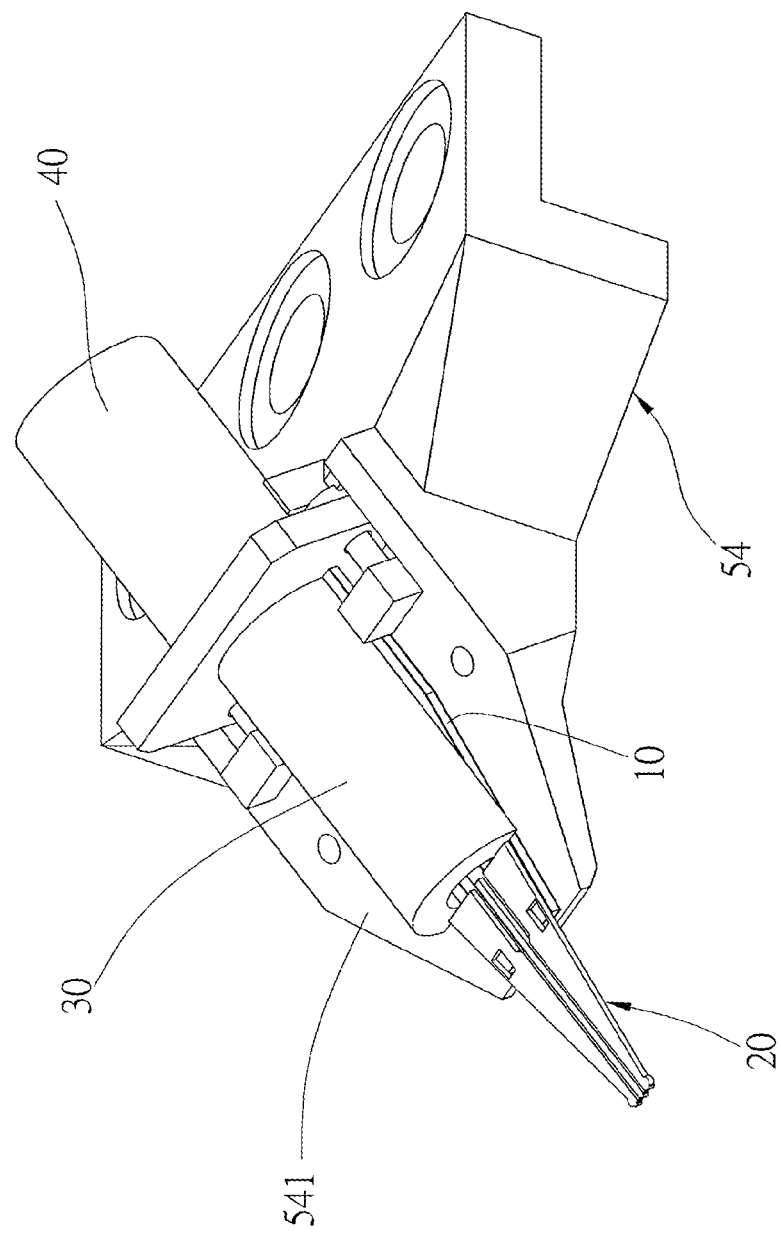
FIG. 4 is a perspective view of the preferred embodiment of the present invention, showing the PCB on the bottom case.

The housing 50 has a top case 52 and a bottom case 54 connected together to form a room therein. The top case 52 has a first opening 521 and a second opening 522 at opposite ends and communicated with the room. The bottom case 54 has a table 541 and two connecting boards 542 on a side of the table 541. As shown in FIG. 4, the PCB 10 and the signal connector 40 are fixed to the table 541 of the bottom case 54 by bolts while the probe set 20 and the signal connector 40 are fixed to the PCB 10. Next, the top case 52 is connected to the table 541 to cover the PCB 10 and the resonating member 30 on the table 541 thereunder, and the resonating member 30 is between the PCB 10 and the top case 52. The probe set 20 extends out of the housing 50 via the first opening 521, and the signal connector 40 extends out of the housing 50 via the second opening 52.

In the beginning of a testing task, the operator secures the boards 542 to a testing arm of the tester, and connects the signal connector 40 to a coaxial cable of the tester. Next, the operator operates the tester to move the testing arm, so that the probe module is moved toward the DUT to make the probes 21, 22 of the probe set 20 touch specific pads of the DUT, and then it may start the testing task.

The semicircular sidewall (or called curved sidewall) of the chamber 32 of the resonating member 30 may correct the shifts of the probes to lower the effect of the electric field. The resonating member 30 provides the circuit 14 and the groundings 16 with the shielding effect to stabilize the electric field of the probe set as well as to isolate the interference from outside.

In conclusion, the present invention may stabilize the electric field to increase the yield rate of manufacturing the probe module, and increase the precision of the test.

It must be pointed out that the embodiments described above are only some preferred embodiments of the present invention. All equivalent structures which employ the concepts disclosed in this specification and the appended claims should fall within the scope of the present invention.

What is claimed is:

1. A probe module, comprising:
 a housing having a room therein, a first opening, and a second opening at opposite ends thereof, wherein the first opening and the second opening are at opposite ends of the housing, and communicated with the room;
 a PCB received in the room of the housing, and having a substrate, on which a circuit and at least one grounding are provided, wherein the substrate is connected to the housing;
 a plurality of probes, which are made of a conductive material, fixed to the substrate by welding, and electrical connected to the circuit and the at least one grounding of the PCB respectively, wherein the probes extend out of the housing via the first opening;
 a resonating member having a chamber and an opening communicated with the chamber, wherein the resonating member is attached to the PCB with a side having the opening; the resonating member is between the PCB and the housing; and the chamber has a sidewall facing the substrate of the PCB; and
 a signal connector connected to the PCB and extending out of the housing via the second opening, wherein the signal connector has a signal transmission portion and a grounding portion; the signal transmission portion is electrically connected to the circuit of the PCB, and the grounding portion is electrically connected to the at least one grounding of the PCB.

2. The probe module of claim 1, wherein the housing has a top case and a bottom case; the PCB is connected to the bottom case; the bottom case has the first opening and the second opening at opposite ends thereof, and the top case is connected to the bottom case to cover the PCB and the resonating member.

3. The probe module of claim 1, wherein the sidewall of the chamber of the resonating member is curved.

4. The probe module of claim 1, wherein the sidewall of the chamber of the resonating member is semicircular.

5. The probe module of claim 1, wherein the resonating member is made of a conductive material, and electrically connected to the at least one grounding of the PCB.

6. The probe module of claim 1, wherein two of the at least one grounding are provided on the substrate, and the circuit is between the groundings; and the groundings are electrically connected to the grounding portion of the signal connector.

7. The probe module of claim 6, wherein three of the probes are provided, one of which is electrically connected to the circuit, and the other two of which are electrically connected to the groundings respectively.

8. The probe module of claim 6, wherein the resonating member is made of a conductive material, and has opposite ends electrically connected to the groundings of the PCB respectively by welding.

9. The probe module of claim 1, wherein the signal connector further includes an insulating pad between the signal transmission portion and the grounding portion.

10. The probe module of claim 1, wherein the chamber of the resonating member is opened at opposite ends of the resonating member.

* * * * *